US006404252B1

(12) United States Patent
Wilsch

(10) Patent No.: US 6,404,252 B1
(45) Date of Patent: Jun. 11, 2002

(54) NO STANDBY CURRENT CONSUMING START UP CIRCUIT

(75) Inventor: Harald Wilsch, Tuerkenfeld (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/630,159

(22) Filed: Jul. 31, 2000

(51) Int. Cl.[7] .................................................. H03K 3/02

(52) U.S. Cl. ........................ 327/198; 327/143; 327/538; 327/545; 323/312; 323/315

(58) Field of Search ................................. 327/142, 143, 327/198, 538, 540, 544, 545, 548; 323/312, 315, 316

(56) References Cited

U.S. PATENT DOCUMENTS 4,890,011 A * 12/1989 Miyatake .................... 327/537
5,003,197 A * 3/1991 Nojima et al. .............. 327/536
5,155,384 A 10/1992 Ruetz .......................... 327/537
5,164,614 A 11/1992 Maekawa ................... 327/537
5,227,675 A * 7/1993 Taguchi ....................... 327/534
5,243,231 A 9/1993 Baik ........................... 327/544
5,867,013 A 2/1999 Yu .............................. 323/314
5,889,430 A * 3/1999 Csanky ........................ 327/543
5,892,388 A 4/1999 Chiu ........................... 327/543
5,969,549 A 10/1999 Kim et al. .................. 327/143
6,016,050 A 1/2000 Brokaw ....................... 323/315
6,060,918 A 5/2000 Tsuchida et al. ............ 327/143
6,114,917 A * 9/2000 Nakajima et al. ............. 331/57
6,154,100 A * 11/2000 Okamoto ..................... 331/57

OTHER PUBLICATIONS

G. Tzanateas, C.A.T. Salama, and Y.P. Tsividis, A CMOS Bandgap Voltage Reference, IEEE Journal of Solid–State Circuits, vol. SC–14, No. 3, Jun. 1979, pp. 655–657.

* cited by examiner

*Primary Examiner*—Timothy P. Callahan
*Assistant Examiner*—An T. Luu
(74) *Attorney, Agent, or Firm*—Brett A. Hertzberg

(57) ABSTRACT

A start-up circuit for a bias generator circuit includes an oscillator, a power monitoring circuit and a controllable current source. As the power supplies begin to ramp up to their final voltage, the power monitoring circuit monitors power consumed by the oscillator. As the oscillator begins to ring, the power monitoring circuit couples a control signal to the controllable current source, which generates a current used to start-up the bias generator circuit. Once the bias generator circuit has achieved an active operating condition, the start-up circuit is disengaged from the bias circuit by disabling the oscillator. The start-up circuit does not consume any standby current when disabled, and does not effect the operation of the bias generator circuit.

24 Claims, 9 Drawing Sheets

NO STANDBY CURRENT CONSUMING START UP CIRCUIT

BACKGROUND OF THE INVENTION

1. Field of the Invention

The present invention relates to the design of electronic circuits that are useful in low power, low current electronic systems. In particular, the present invention relates to electronic circuits that utilize start up circuits, the start up circuits consuming no stand by current upon the completion of a start up sequence.

2. Description of the Prior Art

Typical microelectronic systems have various electronic components that often share one or more common biasing circuits. Examples of circuits that have common biasing arrangements include operational amplifiers, comparators, and other analog components such as level detectors.

MOS type transistors function as voltage controlled devices where the conduction channel is activated by applying a voltage field across the conduction channel. Because MOS devices are field effect devices with an insulated gate structure, current does not flow through the devices' gate terminals. Since MOS transistors only consume power when biased in their active region, MOS transistors are useful in low power circuits. For example, a typical CMOS digital inverter circuit does not use any power unless it is transitioning from one logic state to another. MOS transistors are thus widely used in digital electronic systems for their reduced power consumption characteristics.

Analog circuits tend to use more power than digital circuits in part due to the active nature of the circuits. Linear amplifiers, comparators and other analog circuits normally require biasing circuits for proper operation. Unlike many digital circuits, analog circuits tend to consume "stand-by" current. For this reason, it is often desired to consolidate biasing circuits from various analog circuits into one common biasing circuit in order to reduce overall system power.

A simple biasing arrangement using MOS devices includes a diode-connected transistor that is series connected to a resistor, the combination connected across the power supply. The diode-connected transistor will conduct current as soon as the power supply levels exceed the threshold voltage of the transistor. Once the power supply has reached its full potential, the current through the diode-connected device is inversely proportional to the resistor value. The gate connection of the diode connected device functions as a biasing voltage for other transistors. The gate connections of the other transistors are connected to the common biasing voltage in such a way that the other transistors will also conduct a current level that is inversely proportional to the resistor in the bias circuit.

The diode/resistor combination discussed above is not well suited for ultra low power microchip applications. In order to keep the overall power consumption down, the resistor must have a relatively high value (>1MΩ). For Example, when the resistor in the bias circuit has a value of 5MΩ, the diode-connected device will consume roughly 860 nA on a 5 Volt supply (4.3 v/5MΩ=860 nA). Thus, where the microchip power budget is on the order of 1 or 2 μA, almost an entire μA of current will be used up on the biasing arrangement alone (approximately 40% of the power budget). The diode/resistor arrangement suffers from poor regulation over varied power supply voltages. In addition, the simple diode/resistor circuit tends to have poor regulation performance over varying temperature ranges.

Another example of a conventional biasing arrangement is known as a "$V_t$ generator". Many modern CMOS processes are based on P-type doped substrates. Parasitic PNP transistors are inherently formed in the substrate of p-type CMOS circuits, with a fixed collector connected to the substrate. The parasitic PNP devices can be configured as diodes. A "$V_t$ generator" uses the temperature dependent characteristics of diode connected parasitic PNP devices to generate a voltage proportional to absolute temperature (VPTAT). A circuit is arranged using current mirrors with diode connected devices in such a way as to form a "vptat-loop", which generates a voltage drop across a resistor. The voltage drop is normally very small ($V_t$ is on the order of 26 mV).

The VPTAT generator biasing arrangement requires a smaller resistor value as compared to the diode/resistor circuit previously discussed. The current density of each parasitic diode connected device in a VPTAT generator is proportional to the current mirror ratio and the area of the diode. The voltage across the resistor is given by $V_R=V_t\cdot\ln((I_{C1}\cdot I_{S2}/(I_{C2}\cdot I_{S1}))$, where $I_{C1}$, $I_{C2}$ are the currents in the mirrors and $I_{S1}$, $I_{S2}$ are proportional to the emitter areas ($A_1$, $A_2$) of the diodes. The voltage across the resistor is also given as $V_R=I_{C2}\cdot R$. Thus, $R=V_R/I_{C2}=(V_t/I_{C2})\cdot\ln((I_{C1}\cdot I_{S2})/(I_{C2}\cdot I_{S1}))$. For example, if the ratio of currents in the mirror are 1:1 ($I_{C1}$:$I_{C2}$), the bias current is 860 nA, the ratio of the diode emitter areas is 4:1 ($I_{S2}$:$I_{S1}$), and the $V_t$ is 26 mV, then the resistor value which is required in the VPTAT generator is given by: R=(26 mV/860 nA)*ln(4)=42KΩ. This is substantially less than the 5MΩ resistor which is required in the simple diode/resistor biasing circuit previously discussed. In addition, the VPTAT generator provides a supply voltage independent bias current which consumes less die area than the diode/resistor arrangement. However, the VPTAT generator produces a bias current that is dependent upon temperature.

A further conventional biasing arrangement counteracts temperature effects by using a so-called "band-gap" reference circuit. Band-gap reference circuits use the inherent characteristics of bipolar transistors (often connected as diode devices by shorting the collector and base together) to compensate for detrimental temperature effects. The energy band-gap of Silicon is on the order of 1.2 V, and is independent from temperature and power supply variations. Bipolar transistors have a negative temperature drift with respect to the base-emitter voltage ($V_{be}$ decreases as operating temperature increases). However, the thermal voltage of a bipolar transistor has a positive temperature drift ($V_t$=kT/q, thus $V_t$ increases as temperature increases). Thus, the negative temperature drift in a bipolar transistor base-emitter voltage is counteracted by the positive temperature drift in the thermal voltage ($V_t$).

One typical problem associated with band-gap type reference circuits, as well as other electronic circuits, is that there is a possibility that during the power up sequence, the transistors will find a state where they will not turn on. VPTAT and bandgap reference circuits are circuits that are configured as feedback circuits. When the voltage gain in the feedback loop is too high, an unstable operating condition results. Typically the gain in the feedback loop must be maintained at a lower level to permit stable operation. As discussed previously, it is likely that the reference circuit is being used as a biasing reference for other circuits. To ensure proper functionality of circuits that share the common biasing connection, it is crucial that the reference circuit properly starts-up when the power is turned on and simultaneously finds a stable operating condition.

One way to ensure start-up of a circuit is to form a conduction path from one supply through a transistor in the problematic circuit. This in turn causes the problematic circuit to enter a known state of active operation. For example, a resistor can be connected between one of the respective power supplies and a diode connected device in the reference circuit. The resistor and diode device form the conduction path in the reference circuit. The diode device will begin to conduct and in turn the circuit will begin normal operation.

A problem with the above described resistor conduction path approach is that the resistor will remain connected to the reference circuit even though the reference circuit has reached normal operating levels. For ultra low power circuits the total power budget is on the order of 1 or 2 $\mu$A. The continued conduction through the resistor has a disadvantage in that the start-up path consumes constant power. Thus, in order to reduce the loss of power due to the start-up resistor, the resistor needs to have a very high ohmic value. The continued conduction through the resistor may also introduce an offset in the reference circuit.

In integrated circuits, high value resistors require large sheet resistance materials to be integrated onto the chip. Typical resistivity values for readily available materials such as polysilicon are on the order of 1 k$\Omega$/□. Well material typically has a sheet resistance on the order of 10 k$\Omega$/□. For resistance values over 1M$\Omega$, low doped, high ohmic integrated resistors consume substantial amounts of die area. Additionally, dioderesistor arrangements suffer from temperature instability as the resistance varies widely due to high temperature coefficients. High value integrated circuit resistors also suffer from junction leakage, high junction capacitance and are often subject to poor process control.

Some semiconductor manufacturing processes offer resistors called "Epi-FET" or "pinched" resistors. These resistors are higher in sheet resistivity, where resistivity increases as the supply voltage increases. However, these resistors are subject to poor process control and often have reliability problems at cold temperatures.

Simple capacitive circuits are also used as start-up circuits. Capacitive circuits assume that a known or well-defined charge condition exists on the capacitors both before and during start-up. If the start up circuit does not reach a known or well defined condition (i.e., completely discharged or fully charged), there is a possibility that the reference circuit will not properly initialize and start-up.

SUMMARY OF THE INVENTION

The present invention relates to a start-up circuit and method for securing a stable start-up behavior for a bias generator circuit. Typical bias circuit arrangements will successfully start-up under normal operating conditions. Under extreme operating conditions such as very cold temperatures and low "beta" process corners, bias circuits often behave unpredictably and may not find a conductive operating condition. Start-up circuits and methods according to the invention cooperate with the "natural" start up of most bias circuits to enhance the predictability and reliability of the bias circuit achieving proper conduction.

The present invention is related to a start-up circuit for forcing a bias generator circuit into a known steady-state condition during a power-up sequence. According to one aspect of the invention, cross-currents and capacitive gate charging currents of a ring oscillator are used to ensure proper start-up of the bias circuit. A detector circuit monitors potential changes in the power supply during power up. As the power supply is brought up to a full potential, the detector circuit detects the potential changes in the power supply and monitors activity in the ring oscillator. The detector circuit controls a current source circuit. The detector circuit together with the current source circuit monitor activity of the oscillator, and feeds a start-up current into a section of the bias generator circuit. The start-up current forces the bias generator circuit into an active state of operation. After the biasing currents become active, a shut down circuit cuts off the current flow into the ring-oscillator, thereby minimizing total power consumption.

In a voltage proportional to absolute temperature (VPTAT) type bias circuit, there is possibility that the bias circuit will not find a conductive operating point after the power supply reaches its operating potential. A capacitive voltage divider is used detect the power supply power-up. An output of the capacitive voltage divider is coupled to an input to a ring oscillator. The ring oscillator has an extremely high voltage gain such that the ring oscillator will easily achieve an oscillating condition with very little input voltage (due to its high instability). A current mirror detects current flowing through the ring-oscillator and generates a start-up current for the VPTAT generator. The start-up current activates the biasing transistors in the VPTAT generator. Once the VPTAT generator turns on, the biasing transistors become active and biasing currents begin to flow. The biasing currents in turn activate a transistor switch that deactivates the ring oscillator, thereby reducing the total current flow in the electronic system.

According to a feature of the invention, an apparatus forces a startup current into a selected node in a current path of a bias circuit when power is activated, comprising: an oscillator; wherein the oscillator oscillates when active, a monitor, wherein the monitor produces a control signal when the oscillator is active, and a current source that includes a current control input coupled to the control signal, wherein the current source provides the start-up current at the selected node in response to the control signal such that the current path in the bias circuit is activated into a conducting state when the oscillator consumes power.

It is a further feature of the invention to provide for an apparatus as described above, wherein the oscillator includes an oscillator control input that disables the oscillator when activated, whereby power consumption is reduced. The oscillator includes an input node, an output node, and a feedback circuit coupled between the input node and the output node, whereby the feedback circuit forms a feedback loop in the oscillator. The feedback circuit may include a capacitor.

According to another feature of the invention, the apparatus further includes a switch circuit that couples the input node of the oscillator to a potential when activated, wherein the switch circuit is activated when the bias circuit actively conducts such that and the potential is coupled to the input node of the oscillator and the oscillator is disabled to reduce power consumption. The switch circuit may include any variety of switching elements such as a MOS transistor, a bipolar transistor, as well as other switching elements. The activation of the switch is controlled.

According to yet another feature of the invention, the apparatus further provides for the oscillator including an inverting circuit and the feedback circuit includes a capacitor to ac couple the output node to the input node of the oscillator when the oscillator is active. The capacitor isolates the input node from the output node of the oscillator when the oscillator is disabled.

According to a further feature of the invention, the apparatus further provides for a noise injector that couples noise from a power supply line to the input node of the oscillator, wherein the noise coupled to the input node of the oscillator initiates oscillation of the oscillator. The noise injector may include a capacitor that couples noise from the power supply line to the input node of the oscillator. Alternatively, the noise injector may include a first capacitor connected between a power supply line and the input of the oscillator, and a second capacitor connected between another power supply line and the input of the oscillator such that the first and second capacitors inject charge into the oscillator.

According to still another feature of the invention, the apparatus further provides that the monitor includes a transistor that operates as a diode and the transistor is forward biased when the oscillator is active. The current source may include another transistor that conducts the start-up current when the transistor for the monitor conducts. The operation of the current source is controlled. The monitor may include a first transistor and the current source include a second transistor such that the first and second transistors form a mirror pair where current flowing in the second transistor is proportional to current flowing in the oscillator when the oscillator is active. The current source may also include a current amplifier circuit. The monitor senses one of a current flow and a voltage change in the oscillator when the oscillator is active.

According to a feature of the invention, a start-up circuit is provided that couples a start-up current into a selected node in a current path of a bias circuit when power is activated, comprising: an oscillator, wherein the oscillator consumes power when active, a control means produces a control signal proportional to power consumption in the oscillator, a current source includes a control input coupled to the control signal such that the current source provides the start-up current proportional to the power consumption of the oscillator, and coupling means couples the start-up current to the selected node such that the current path in the bias circuit is forced into a conducting state, whereby and said bias circuit is activated. The start-up circuit may further provide for detection means produces a bias active signal when the bias circuit is in active operation, and disable means to disable the oscillator in response to the active signal such that the oscillator is disabled when the bias circuit is active and power consumption is reduced. Furthermore, injection means couples a noise signal into the oscillator circuit to initiate oscillations in the oscillator.

According to another feature of the invention, a method of using an oscillator to force a bias circuit into an active state of operation, provides for: detecting an oscillation in the oscillator to produce an oscillator active signal, producing a start-up current in response to the oscillator active signal, feeding the start-up current into the bias circuit to force the bias circuit into the active state of operation, detecting the active state of operation to produce a bias active signal, and disabling the oscillator circuit in response to said bias active signal such that the oscillator is inactive when the bias circuit is active and power consumption is reduced. The method may further include injecting noise into the oscillator circuit to initiate oscillations in the oscillator.

Briefly stated, the invention provides a start-up circuit for a bias generator circuit including an oscillator, a power monitoring circuit and a controllable current source. As the power supplies begin to ramp up to their final voltage, the power monitoring circuit monitors power consumed by the oscillator. As the oscillator begins to ring, the power monitoring circuit couples a control signal to the controllable current source, which generates a current used to start-up the bias generator circuit. Once the bias generator circuit has achieved an active operating condition, the startup circuit is disengaged from the bias circuit by disabling the oscillator. The start-up circuit does not consume any standby current when disabled, and does not effect the operation of the bias generator circuit.

DETAILED DESCRIPTION OF THE PREFERRED EMBODIMENT

Figure 1:
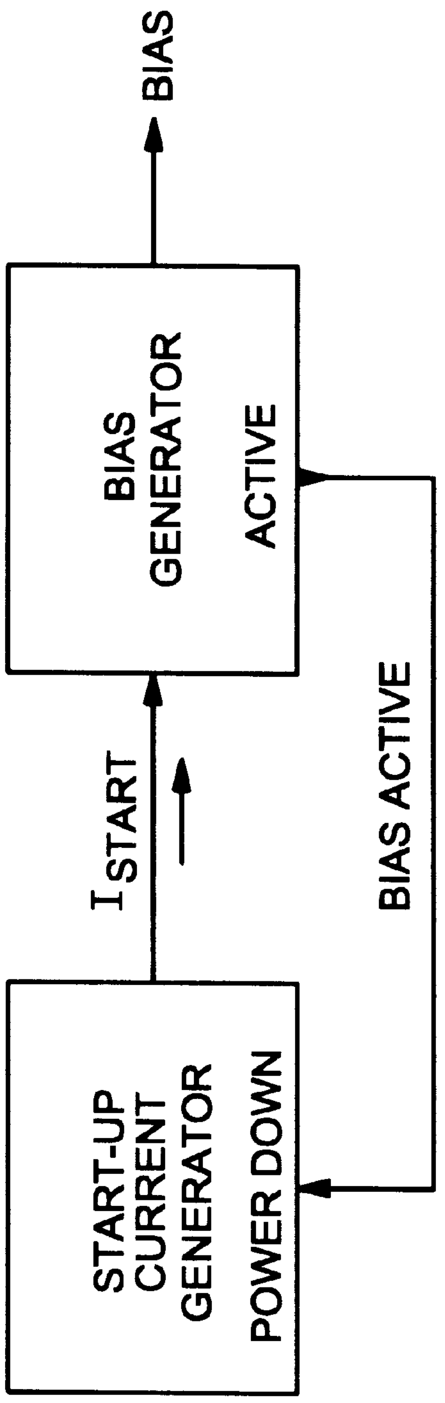
FIG. 1 shows a block diagram of the invention.

FIG. 1 is a block diagram of a preferred embodiment of the invention. As shown in FIG. 1, a start up current generator circuit feeds a startup current ($I_{START}$) into a bias generator circuit. The bias generator has a signal output (Active), which indicates that the bias generator has reached an operational condition. The start-up generator circuit has a power down control input. Once the bias generator reaches an operational condition, the bias generator circuit produces a bias active signal indicating that the bias generator circuit is operating. The bias active signal is fed into the power down control input of the start-up circuit, causing the start-up generator circuit to be deactivated. When the start-up generator is deactivated, the bias circuit is in an active operating condition, and the start-up generator circuit does not drain the power supply.

Figure 2:
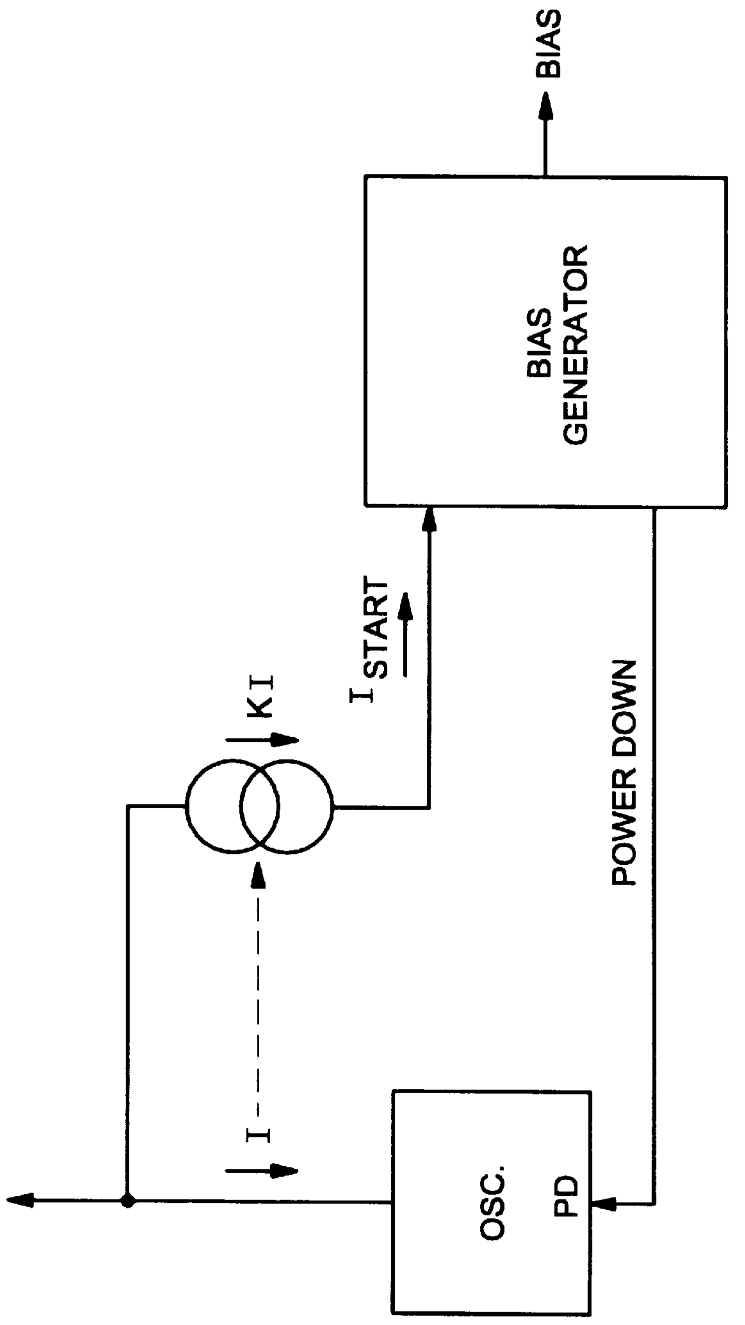
FIG. 2 shows another embodiment of the invention.

Details of the start up current generator are shown in FIG. 2. The start up current generator circuit includes an oscillator (OSC) and a current controlled current source. Although a current controlled current source is shown in the drawings, other current generating devices may be substituted such as a voltage controlled current source, as well as others. Power is fed into the oscillator circuit through a current sense circuit. When the power supply permits operation of the oscillator, current is drawn into the oscillator (I) through the current sense circuit. The current through the current sense circuit (I) is ratio mirrored (k×I, where k is a constant), generating the start-up current ($I_{START}$).

Power supply circuits in electronic systems reach their full potential over a time interval that is not instantaneous. During the time interval (power-up sequence), the voltages ramp up until the power supply reaches a stable steady-state potential. By monitoring the current flowing into various circuits we can determine when the power supply has reached its steady state condition.

An oscillator circuit is used to generate a start-up current as shown in FIG. 2. The current flowing into the oscillator block is monitored. As the power supply begins to ramp-up the oscillator will not immediate begin to oscillate. Since the oscillator contains transistors that do not begin to conduct current until the power supply has ramped-up to a critical potential, the oscillator will not begin to oscillate immediately. The built in threshold of the transistors in the oscillator circuit determine the critical potential (i.e., 0.8 V for an NMOS transistor and −0.8 V for a PMOS transistor) where oscillation begins. Once the oscillator begins to oscillate, current through the oscillator circuit is monitored and the start-up current ($I_{START}$) is activated.

A typical oscillator circuit is made up of an odd number of inverting stages that are connected together in a feedback loop. A higher number of inverting stages will result in an increase in gain through the oscillator block (i.e. 13 inverting stages). A high gain oscillator is desired to secure a proper start up condition. Each inverting stage will have a gain that is proportional to process dependent transistor gains. Thus, the number of inverting stages in the oscillator can be optimized to achieve an optimal gain. Because the oscillator has a very high gain, very little input voltage is required to cause the oscillator output to swing to the supply rails.

A simple CMOS inverter contains two transistors (one N-type, one P-type) series connected with a common gate connection. By monitoring the activity of the oscillator, we can deduce that the power supply has ramped up to a critical potential where operation of those transistors can take place. Thus, once the oscillator begins to oscillate, we are assured that the power supply voltage has exceeded at least the threshold of an N and P type MOS transistor.

As discussed above, the current flowing through the oscillator block can be used to generate a start-up current. A simple MOS transistor current mirror can be used to monitor the current flowing through the oscillator. As the inverting stages in the oscillator transition from one logic level to another, current flows through the oscillator. As the current flows through the oscillator, the current mirror will generate another current. The current flowing through the current mirror serves as a start-up current ($I_{START}$) for the bias generator circuit.

The start-up current forces a current to flow through certain transistors in the bias circuit, which in turn causes the bias circuit to reach an operating point where the bias circuit has proper current flow. The bias circuit is adapted to generate a control signal indicating that the bias generator has reached an operating point where bias currents are flowing. The control signal (bias active) is fed to a shut down circuit, which may be a simple MOS switch, contained within the oscillator block. When the shut down circuit is activated, the bias generator loop current is on and the oscillator is shut off to conserve power. A gate discharge circuit is connected to the gate of the MOS switch device such that any charge stored on the gate will have a discharge path when the MOS device is turned off. The gate discharge device may be a passive component or an active component.

Figure 3:
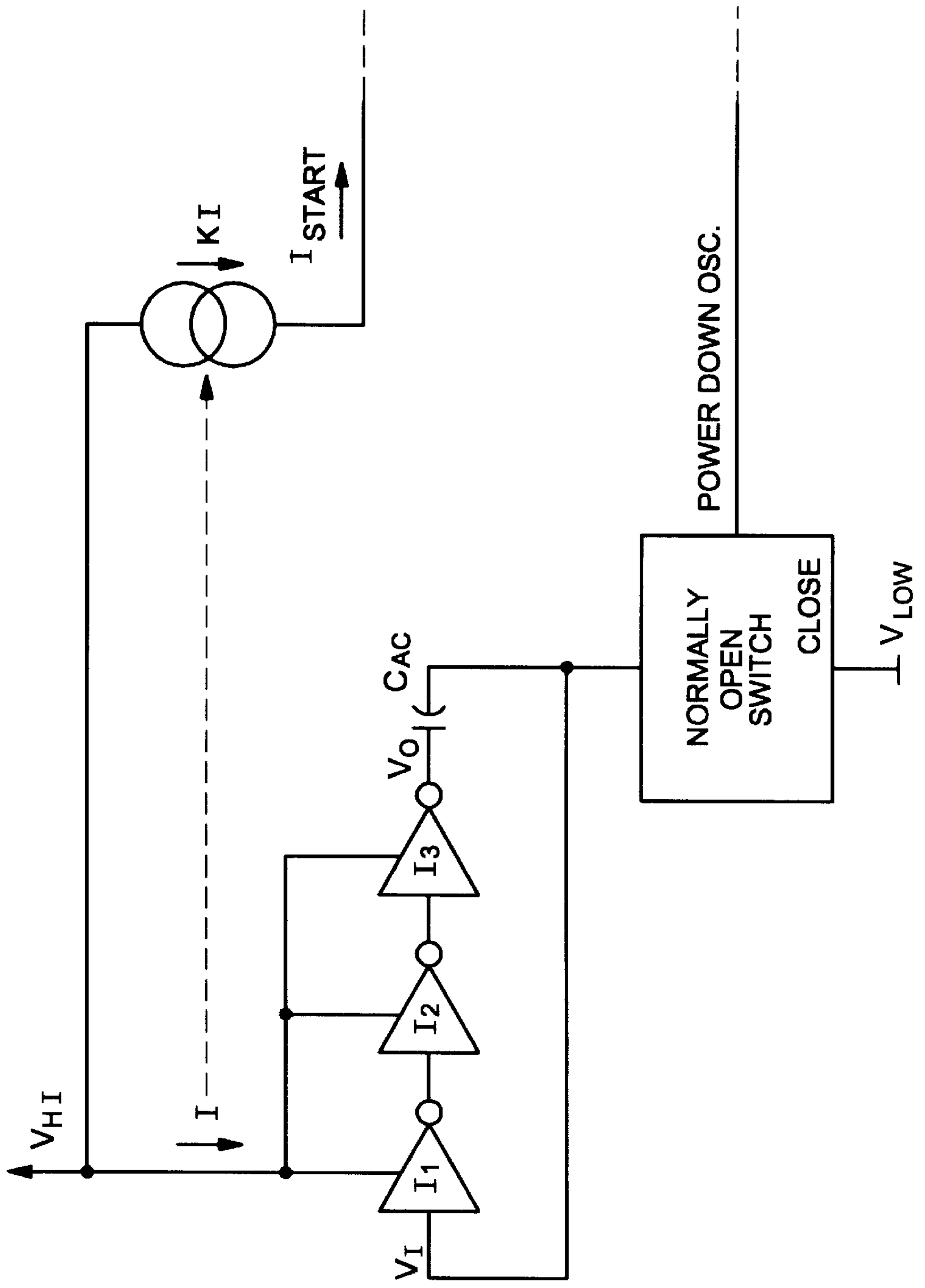
FIG. 3 shows detailed view of a start-up circuit according to the invention.

Many oscillator topologies will work in the start up current generator circuit shown in FIG. 2. For example, FIG. 3 shows a simple ring oscillator circuit that is configured as a start up current generator circuit. Inverters $I_1$–$I_3$ are connected in a ring with an odd number of inversions to provide the basic oscillator. Capacitor $C_{AC}$ forms the feedback path for the oscillator by ac coupling $V_O$ to $V_I$. Inverters $I_1$–$I_3$ are low power inverters (such as MOS), which do not consume power when in a static logic state. However, ring oscillators have extremely high voltage gains because of their inherent instability. Thus, very little input voltage will cause the output of the ring oscillator to swing to the supply rails. While the oscillator is running, i.e. transitioning between logic states, current (I) flows through the inverters causing the start-up current ($I_{START}$) to flow. Current $I_{START}$ is fed into the bias generator circuit to initiate proper start up operation. Once proper operation of the bias generator is established, a bias active signal is coupled into an oscillator shut down mechanism.

According to one embodiment of the invention, a simple normally open controllable switch may be used as the oscillator shut down mechanism. For example, the bias generator drives an active signal into a close input that causes the switch to close. $V_O$ and $V_I$ are DC isolated from one another by capacitor $C_{AC}$. Once the switch is closed, the bottom plate of capacitor $C_{AC}$ is shorted to a potential $V_{LOW}$. Since $V_{LOW}$ is a potential that corresponds to one of the supply rails of inverters $I_1$–$I_3$, the inverters reach a static logic state that causes the oscillator to stop running. Once the oscillator stops running, current I and in turn $I_{START}$ cease to flow.

Figure 4A:
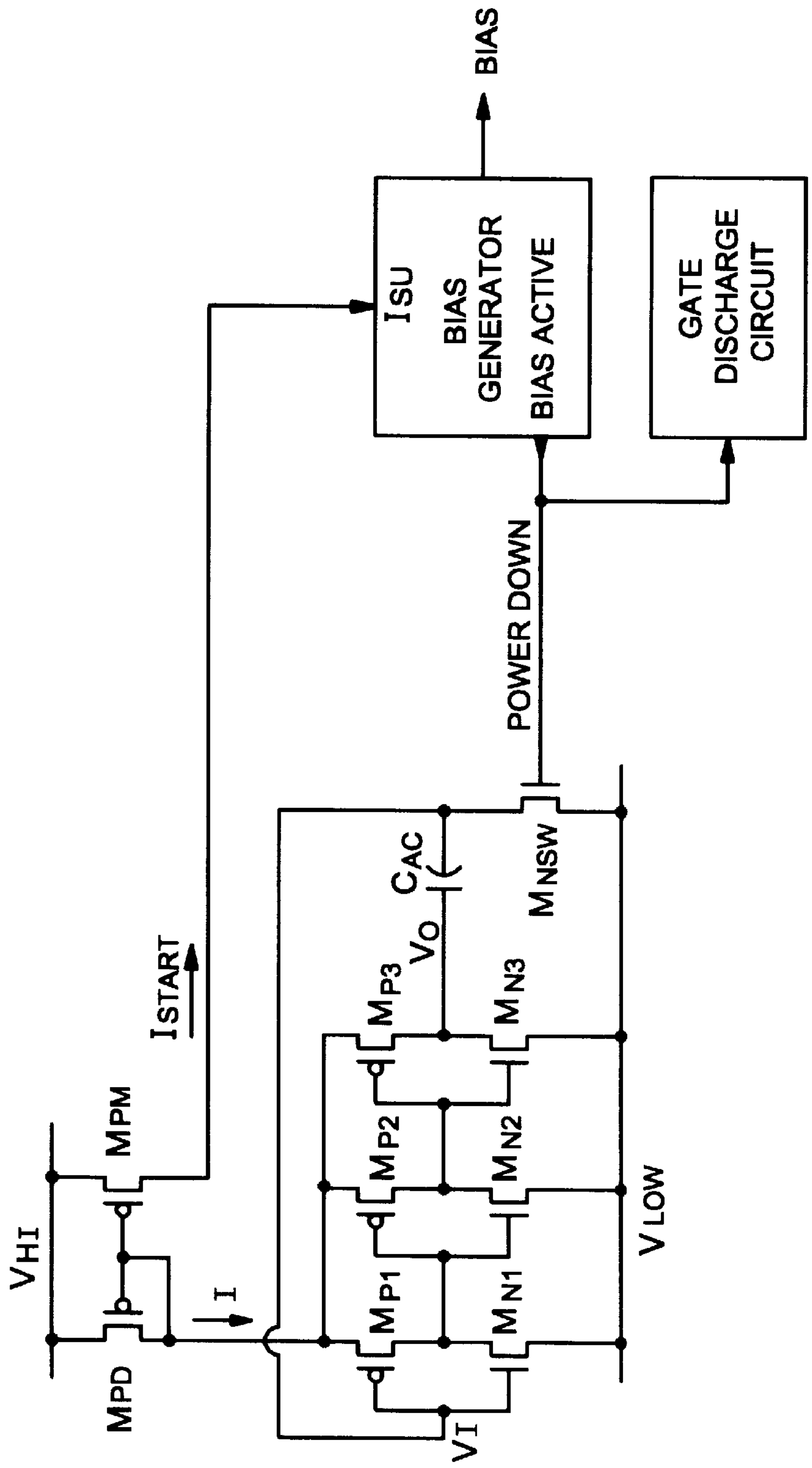
FIG. 4(A) shows one implementation of the circuit shown in FIG. 3.
Figure 4B:
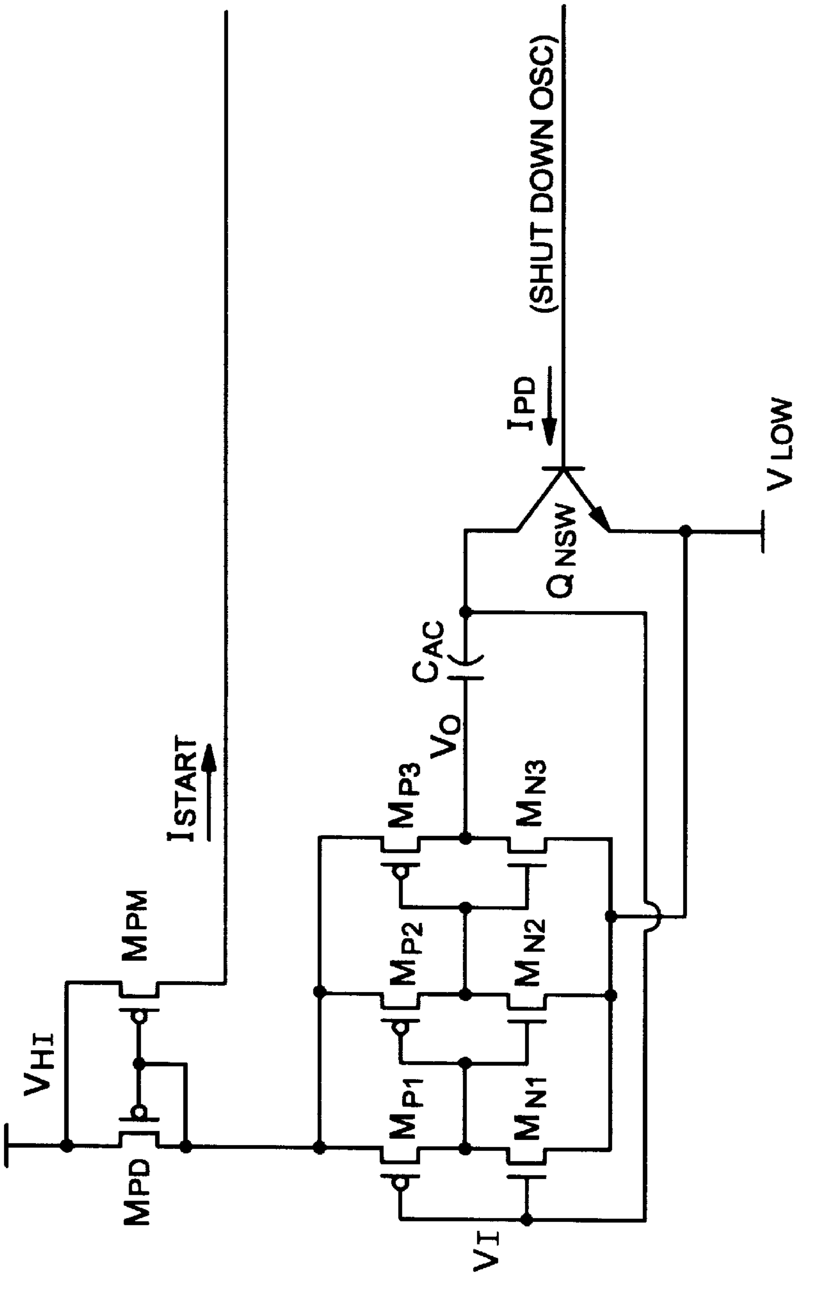
FIG. 4(B) shows another implementation of the circuit shown in FIG. 3.

A controllable ring type oscillator is shown in FIGS. 4A and 4B. Transistor pair $M_{P1}$, $M_{N1}$ form a CMOS type inverter cell (common connected gates forming an input, and common connected drains forming an output). Similarly, $M_{P2}$, $M_{N2}$ and $M_{P3}$, $M_{N3}$ form two more inverter cells. The three inverter cells are connected in an oscillator configuration where the output signal of one inverter cell is coupled to the input stage of the next inverter cell. Capacitor $C_{AC}$ is connected to the output stage of the last inverter cell and the input stage of the first inverter cell. Capacitor $C_{AC}$ is a DC decoupling capacitor forming the feedback loop of the ring oscillator, and DC isolating $V_I$ from $V_O$. $M_{NSW}$ (FIG. 4A) has a drain connection coupled to the bottom plate of capacitor $C_{AC}$ and a source connection coupled to $V_{LOW}$. Similarly, $Q_{NSW}$ (FIG. 4B) has a collector connection coupled to the bottom plate of capacitor $C_{AC}$ and an emitter connection coupled to $V_{LOW}$. $M_{NSW}$ and $Q_{NSW}$ are controlled switches that are activated by a power down signal coupled to the gate or base connection respectively. The power down signal is coupled to the bias active output of the bias generator circuit. When activated, the controlled switches disable the oscillator by shorting the bottom plate of the feedback capacitor ($C_{AC}$) to the low power supply ($V_{LOW}$).

FIG. 4A also shows a gate discharger coupled to the gate of the NMOS switching element $M_{NSW}$. The gate discharger may be a passive or active circuit. The gate discharger serves to discharge the gate of the NMOS device when the POWER DOWN signal switches from high to low. If the disable transistor MNSwis turned off and the gate remains charged, the transistor will remain active preventing the oscillator from oscillating. By ensuring discharge of the gate with a gate discharger circuit (such as a high ohmic component or a diode/resistor combination), oscillation is permitted immediately and start up is ensured.

The feedback capacitor ($C_{AC}$) is important since it prevents a possible DC current path from $M_{P3}$ to QNSW if the oscillator is disabled. This capacitor may cause a rectification effect or DC unbalance during the oscillation and the oscillator may turn off after a number of oscillation cycles due to this, but the number of oscillations will be enough to provide startup of the entire circuit.

Figure 5:
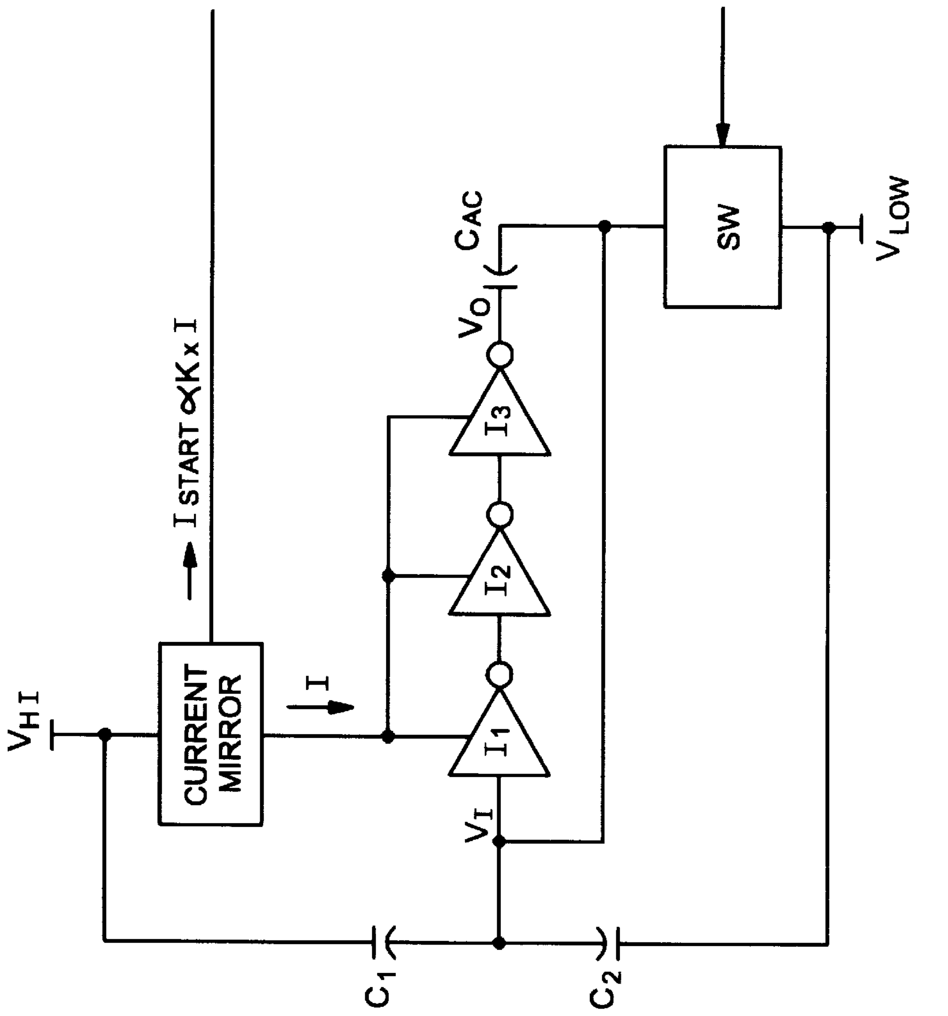
FIG. 5 shows a detailed view of a start-up circuit, including a noise-injection circuit, according to an embodiment of the invention.

A pure CMOS ring oscillator is a circuit that does not require a large amount of die area and has extremely high sensitivity due to its high voltage gain. In some instances a CMOS ring oscillator will find an operating condition that is non-oscillating (i.e., all inverters have inputs and outputs teetering around the middle of the supply rails). A capacitive circuit is shown in FIG. 5 that overcomes this non-oscillation condition. As shown in the figure, capacitors C1 and C2 are series connected across the power supply lines ($V_{HI}$, $V_{LOW}$), sharing a common point at the input to the oscillator circuit $V_I$. Capacitors $C_1$ and $C_2$ inject noise into the input of the ring oscillator ($V_I$). Various noise sources are normally present on the power supply lines $V_{LOW}$ and $V_{HI}$. For Example, a typical electronic system may have a clock oscillator or other circuit that normally has a certain amount of ripple or high frequency noise present. This AC noise is coupled directly into the input of the first inverter stage of the oscillator. Since CMOS inverters have high gain, the noise coupled to the input stage of the inverter causes the first inverter's output stage to swing to a clear high or low logic level.

Figure 6A:
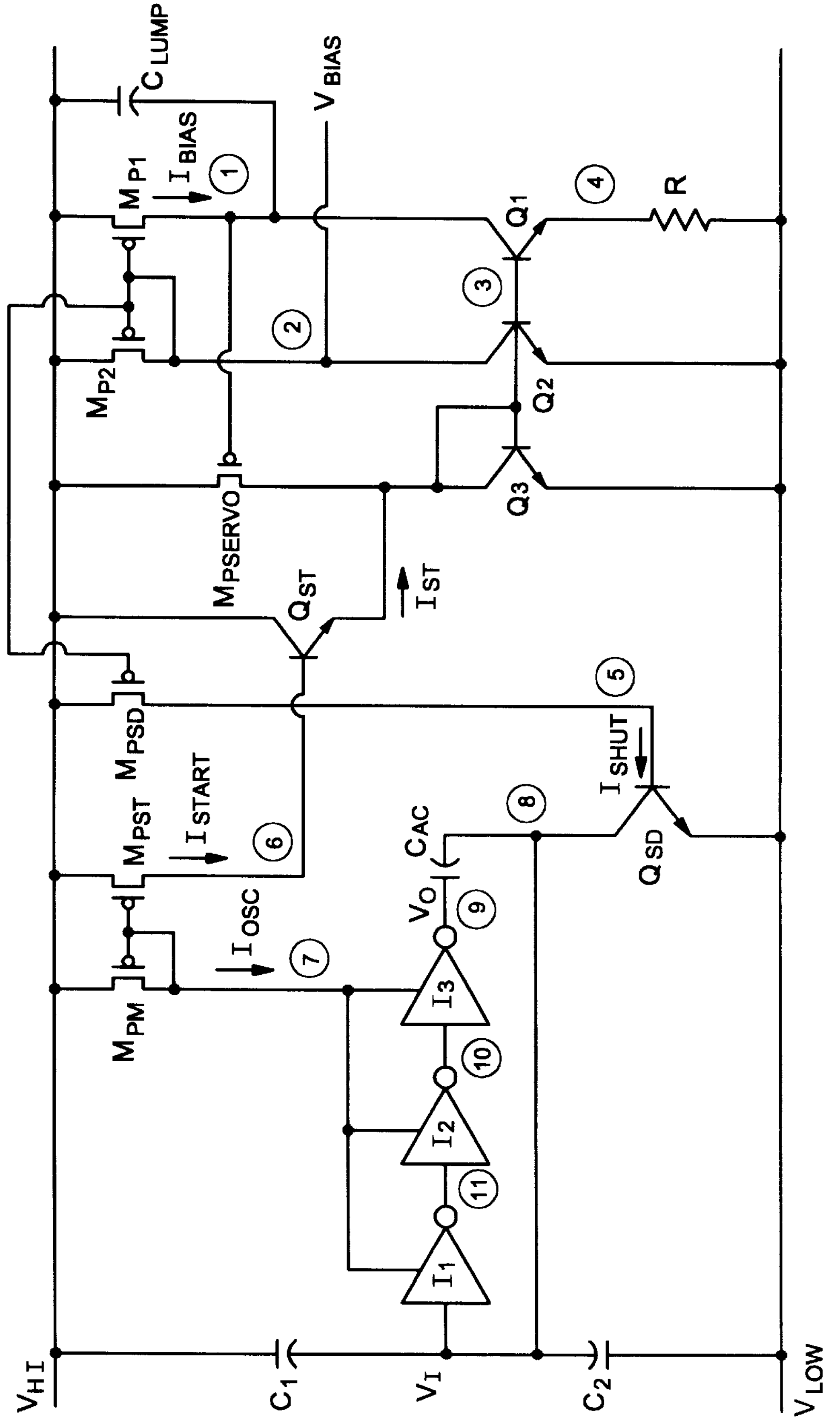
FIG. 6(A) shows a detailed view of a complete start-up circuit according to an embodiment of the invention.

A complete implementation of a biasing circuit with a start-up circuit is shown in FIG. 6(A). The biasing circuit is a VPTAT circuit using a mix of bipolar and MOSFET transistor devices. The bias circuit consists of a P-channel MOS transistor $M_{P1}$ having its source connected to $V_{HI}$, its gate connected to node 2, its drain connected to node 1, a P-channel MOS transistor $M_{P2}$ having its drain and gate connected to node 2 (diode configuration) and its source connected to $V_{HI}$, a P-channel MOS transistor $M_{PSERVO}$ having its gate connected to node 1, its drain connected to node 3 and its source connected to $V_{HI}$, an NPN bipolar transistor $Q_1$ having its collector connected to node 1, its base connected to node 3 and it emitter connected to node 4, an NPN bipolar transistor $Q_2$ having its collector connected to node 2, its base connected to node 3 and its emitter connected to $V_{LOW}$, an NPN bipolar transistor $Q_3$ having its connector and base connected to node 3 (diode connected) and its emitter connected to $V_{LOW}$, a resistor R connected between $V_{LOW}$ and node 4, and a capacitor $C_{COMP}$ connected between $V_{HI}$ and node 1. The emitter areas of $Q_1$ and $Q_2$ are ratio to one another to set up the loop current in the band-gap reference such that the voltage proportional to absolute temperature appears across resistor R. $M_{PSERVO}$ and $Q_3$ form a DC servo loop to improve the line regulation in the loop. $C_{COMP}$ provides compensation to the regulator to prevent oscillations in the regulator from occurring.

The start-up circuit for the VPTAT generator shown in FIG. 6(A) consists of a controllable ring-oscillator with a current monitoring circuit as previously described. The ring oscillator consists of: CMOS inverter $I_1$ having an input connected to node 8 and an output connected to node 11, CMOS inverter $I_2$ having an input connected to node 11 and an output connected to node 10, CMOS inverter $I_3$ having an input connected to node 10 and an output connected to node 9, capacitor $C_{AC}$ having a top plate connected to node 9 and a bottom plate connected to node 8. The positive supplies of inverters $I_1$–$I_3$ are connected to node 7. Capacitors $C_1$ and $C_2$ are series connected to one another across power supplies $V_{HI}$ and $V_{LOW}$ with a common point connected to node 8. A current sense circuit consists of a diode connected P-channel MOS device $M_{PM}$ having a drain and gate connected to node 7, and a source connected to $V_{HI}$. A current mirror circuit consists of a current mirroring P-channel MOS device $M_{PST}$ having a gate connected to node 7, a drain connected to node 6, and a source connected to $V_{HI}$. The current mirror feeds current into the VPTAT circuit through an NPN bipolar transistor $Q_{ST}$ having a base connected to node 6, a collector connected to $V_{HI}$ (alternatively node 1, not shown) and an emitter connected to node 3.

The operation of the start-up circuit will now be described with reference to FIG. 6(A) and FIG. 7. There are essentially three regions of operation for the circuit shown in FIG. 6(A). The first region of operation (region I) is the condition where the power supplies have not reached a level where oscillation is possible in the oscillator. The second region of operation (region II) is where the oscillator begins to oscillate. The third region of operation (region III) is where the bias circuit begins operation.

When power is turned on the voltage across the $V_{HI}$ and $V_{LOW}$ connections will ramp-up to its steady-state supply voltage. Initially (region I), there is no current flowing in the VPTAT biasing circuit, nodes 1 and 2 are at the same potential as $V_{HI}$, and node 3 is at the same potential as $V_{LOW}$. Thus, transistors $M_{P1}$, $M_{P2}$, $M_{PSERVO}$ and $M_{PSD}$ are in a non-conducing (OFF) state since their respective gate-source voltages are zero. Similarly, $Q_1$, $Q_2$ and $Q_3$ are in a nonconducting (OFF) state since their base-emitter voltages are zero. Since no current is flowing through $M_{PSD}$, $Q_{SD}$ is also in an off state.

As the power supplies begin to ramp up, the threshold potential of diode connected P-channel transistor $M_{PM}$ will be exceeded permitting it to become active as the supply further increases. When the power supply levels have reached a sufficient level to permit the inverters ($I_1$–$I_3$) to operate (region II), oscillation will become possible. Because the oscillator has a very high gain, very little input voltage is required to cause the oscillator outputs to swing to the supply rails. Capacitors $C_1$ and $C_2$ couple noise from the power supplies into node 8, which is the input to the firstinverter ($I_1$) in the oscillator. The noise injection causes the output of inverter I1 (node 11) to swing to one of the supply rails ($V_{HI}$, $V_{LOW}$). Each inverter's output is driving into another inverters input, causing the subsequent inverter to drive its output to the opposite logic level. The final stage inverter I3 drives its output into the top plate of capacitor $C_{AC}$ at node 9. Capacitor $C_{AC}$ AC couples the output at node 9 to the input at node 8, forming the feedback loop of the oscillator.

As the power supply continues to ramp up, the oscillator begins to oscillate (region II) consuming higher levels of current. Current mirror $M_{PM}$, $M_{PST}$ will begin to feed current ($I_{START}$) through the base of transistor $Q_{ST}$. As the base current flows through transistor $Q_{ST}$, transistor $Q_{ST}$ begins to become active (pulling charge out of the gate of transistor $M_{PSERVO}$ and capacitor $C_{COMP}$, when connected to node 1) gaining up the start-up current ($I_{START}$) and feeding it into the base of diode connected transistor $Q_3$. The current fed into the base of transistor $Q_3$ causes the base voltage of transistor $Q_3$ to rise. When the base voltage of transistor $Q_3$ reaches the threshold voltage of $Q_3$, transistor $Q_3$ will become forward biased and begin active operation. The base of transistor $Q_2$ is also connected to node 3, causing it to conduct and pull node 2 down from the potential of $V_{HI}$ towards the potential of $V_{LOW}$. Since $M_{P1}$ and $M_{P2}$ are connected as a current mirror, $Q_1$ pulls node 1 down towards the potential of $V_{LOW}$ causing the VPTAT generator to begin to regulate (region III).

As the potential of node 2 drops to the threshold level of transistor $M_{PSD}$ (region III), transistor $M_{PSD}$ begins to conduct driving current into the base of transistor $Q_{SD}$. The base voltage of $Q_{SD}$ rises and $Q_{SD}$ begins to conduct pulling node 8 to the low supply potential $V_{LOW}$. Since the input of the oscillator at node 8 is now tied to a fixed potential, and the oscillator output at node 9 is DC isolated from node 8, the inverters in the oscillator reach a static output potential and oscillations cease.

Once the oscillator stops oscillating (region III), diode connected transistor $M_{PM}$ stops conducting. Since $M_{PST}$ and $M_{PM}$ form a current mirror, $M_{PST}$ also ceases to conduct. $M_{PSERVO}$ and $Q_3$ assist in stabilizing the DC voltage of $V_{BIAS}$, with $C_{COMP}$ providing stability by reducing the overall loop gain. Since the oscillator and current mirrors are shut down, the total power consumption after stabilization of the bias circuit is greatly reduced.

In summary, the start-up sequence of the circuit shown in FIG. 6(A) is as follows below. First, capacitors $C_1$, $C_2$ inject noise into the ring-oscillator circuit at node 8. Second, when the power supply has ramped up sufficiently high, the noise injected in node 8 causes the oscillator to being to ring. Third, current mirror $M_{PM}$ and $M_{PST}$ monitor the current flowing in the oscillator and mirror a start-up current ($I_{START}$) into the base of transistor $Q_{ST}$. Fourth, transistor $Q_{ST}$ gains up the start-up current ($I_{START}$) to generate $I_{ST}$, and feeds current $I_{ST}$ into diode-connected transistor $Q_3$. Fifth, the current flowing in diode-connected transistor $Q_3$ causes currents to flow in mirror connected transistors $Q_1$ and $Q_2$, and the VPTAT loop becomes active. Sixth, the mirror output transistor $M_{PSD}$ becomes active, feeding a current into the base of transistor $Q_{SD}$. Seventh, transistor $Q_{SD}$ shuts off the oscillator and disables the start-up circuit by pulling node 8 to the low power supply. After the start-up circuit is disabled, the loop current remains in operation.

Figure 7:
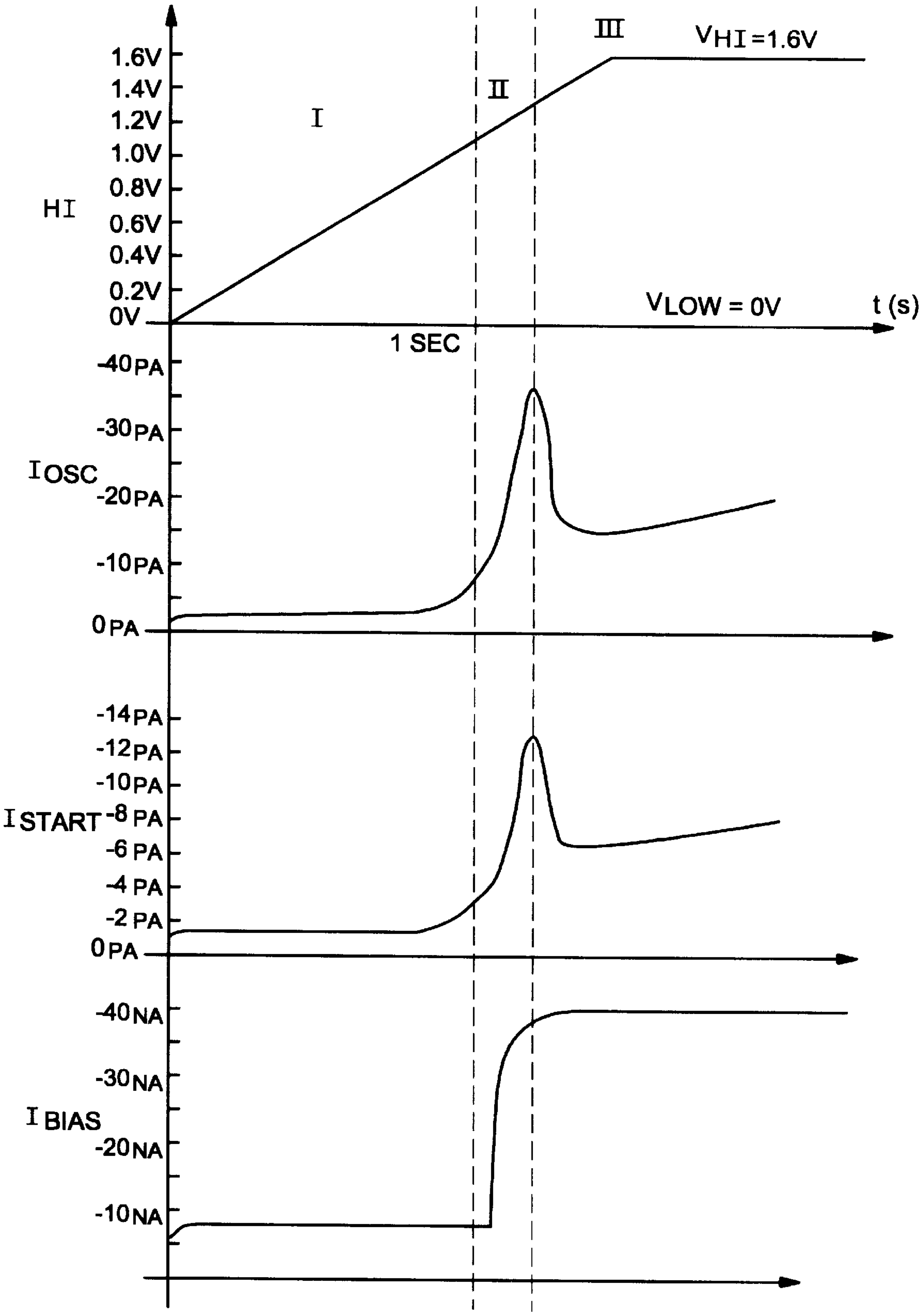
FIG. 7 shows waveforms corresponding to transient signals from the circuit shown in FIG. 6(A).

Although FIG. 7 depicts region II as fairly narrow, the region may be wider, narrower, and/or shifted depending upon many factors. In one instance, the oscillator may be shut down before oscillation ever begins due to a natural start up of the bias circuit. In another instance, the oscillator may oscillate for several cycles before the bias circuit is in normal operation. Process variations may yield higher or lower threshold potentials for each transistor as well as variations in overall transistor gain in the inverter stages. These process variations will cause a shift in the cross-over point between regions I, II and III. Where the gain of the inverters is lower, the supply voltage may have to be higher before the oscillator output signal is has achieved sufficient levels to activate the bias circuit. Similarly, increases in threshold voltages may require a higher supply level before the bias circuit has sufficient power to operate actively. Many other process dependent characteristics will cause similar variations in the point where secure operation is found.

Figure 6B:
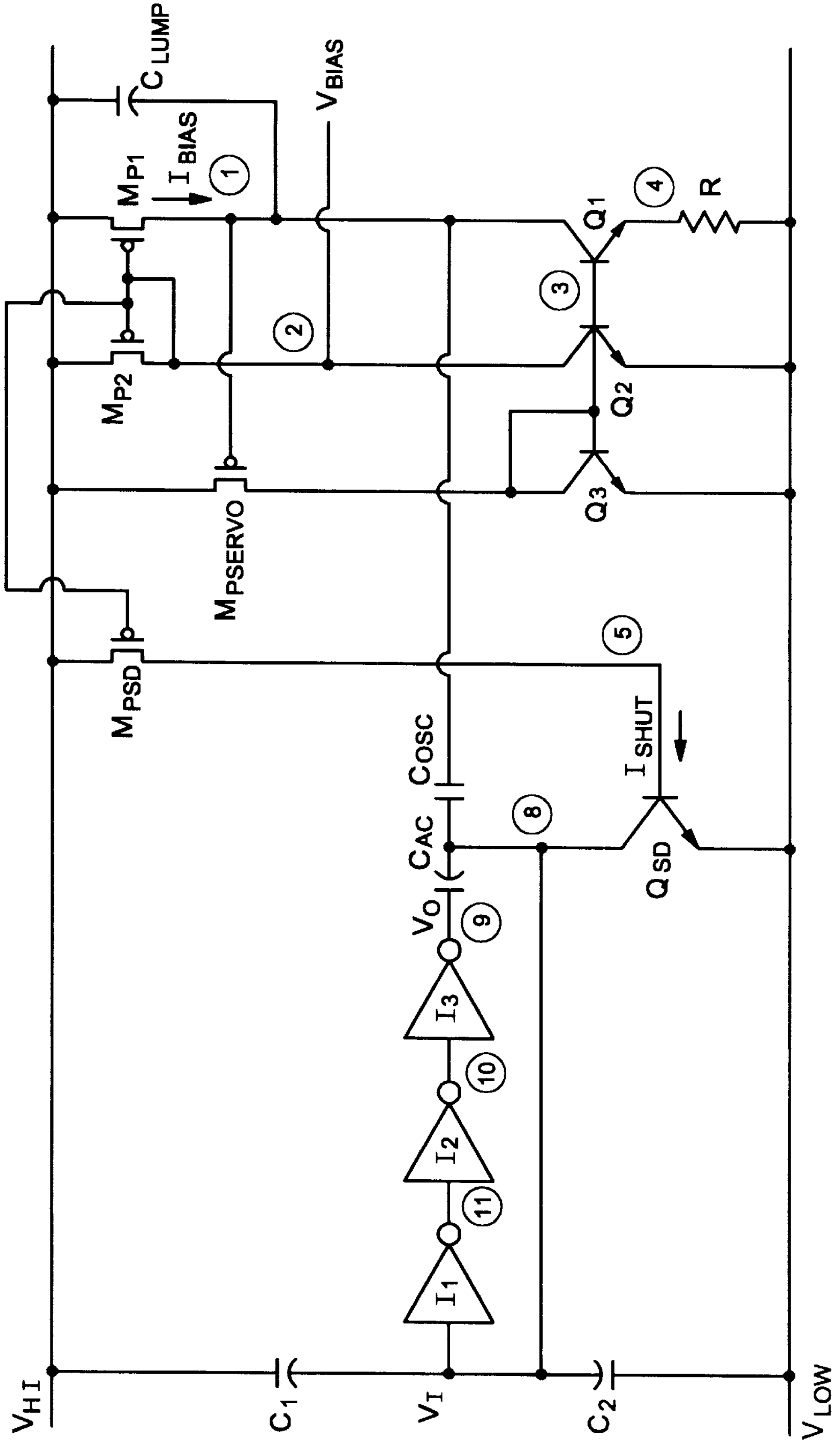
FIG. 6(B) shows a detailed view of a complete start-up circuit according to an embodiment of the invention.

FIG. 6(B) is another embodiment of the invention that is similar to the circuit shown in FIG. 6(A). However, the start-up circuit shown in FIG. 6(B) does not sense the current flowing in the oscillator circuit and instead senses the voltage variations in the output of the oscillator circuit. A coupling circuit is connected between node 8 in the oscillator (alternatively node 9, 10 or 11), and node 1 of the bias circuit (alternatively node 2 or 3). The coupling circuit must include a final stage which DC isolates the bias circuit from the oscillator. The simplest coupling circuit is a single capacitor ($C_{OSC}$). $C_{OSC}$ couples the output of the oscillator at node 8 to node 1 in the bias circuit. During operation, the output voltage variations are coupled to node 1 of the oscillator. When the voltage at node 1 drops below the turn on voltage of $MP_{SERVO}$, $MP_{SERVO}$ will begin to conduct. As $MP_{SERVO}$ begins to conduct, the voltage at node 3 will begin to increase above $V_{LOW}$. The voltage at node 3 will turn on Q1–Q3 causing the bias circuit to start up in a similar manner as that described previously for the circuit shown in FIG. 6(A).

The coupling circuit in FIG. 6(B) includes any appropriate circuit or component that provides DC isolation between the oscillator and the bias circuit. The coupling circuit may not interfere with the normal operation of the bias circuit (i.e. the bias circuit is stable and not oscillating). For example, an inverter coupled to a capacitor, a voltage buffer coupled to a capacitor, and an emitter follower coupled to a capacitor all serve to couple the oscillator voltage to the bias circuit. The coupling circuit may also be connected between any two appropriate nodes in the oscillator and the bias circuit. For example, the input side of the coupling circuit may be connected to nodes 8, 9, 10, or 11, and the output side of the coupling circuit may be coupled to nodes 1, 2, or 3 of the bias circuit. Any other coupling scheme that causes the bias circuit to drive into active operation may be fashioned, as long as it does not interfere with the stable operation of the bias circuit.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus that forces a start-up current into a selected node in a current path of a bias circuit when power is activated, comprising:

an oscillator;

a monitor, wherein the monitor produces a control signal when the oscillator is active such that the control signal is related to the total operating current in the oscillator; and a current source that includes a current control input coupled to the control signal, wherein the current source provides the start-up current at the selected node in response to the control signal such that the current path in the bias circuit is activated into a conducting state when the oscillator consumes power.

2. The apparatus in claim 1, wherein the oscillator includes an oscillator control input that disables the oscillator when activated, whereby power consumption is reduced.

3. The apparatus in claim 1, wherein the oscillator includes an input node, an output node, and a feedback circuit coupled between the input node and the output node, whereby the feedback circuit forms a feedback loop in the oscillator.

4. The apparatus in claim 3, wherein the feedback circuit includes a capacitor.

5. The apparatus in claim 3, further comprising a switch circuit that couples the input node of the oscillator to a potential when activated, wherein the switch circuit is activated when the bias circuit actively conducts such that and the potential is coupled to the input node of the oscillator and the oscillator is disabled to reduce power consumption.

6. The apparatus in claim 5, wherein the switch circuit includes a MOS transistor.

7. The apparatus in claim 5, wherein the switch circuit includes a bipolar transistor.

8. The apparatus in claim 3, wherein the oscillator includes an inverting circuit and the feedback circuit includes a capacitor to ac couple the output node to the input node of the oscillator when the oscillator is active.

9. The apparatus in claim 5, wherein the capacitor isolates the input node from the output node of the oscillator when the oscillator is disabled.

10. The apparatus in claim 3, further comprising a noise injector that couples noise from a power supply line to the input node of the oscillator, wherein the noise coupled to the input node of the oscillator initiates oscillation of the oscillator.

11. The apparatus in claim 10, wherein the noise injector includes a capacitor that couples noise from the power supply line to the input node of the oscillator.

12. The apparatus in claim 10, wherein the noise injector includes a first capacitor connected between a power supply line and the input of the oscillator, and a second capacitor connected between another power supply line and the input of the oscillator such that the first and second capacitors inject charge into the oscillator.

13. The apparatus in claim 1, wherein the monitor includes a transistor that operates as a diode and the transistor is forward biased when the oscillator is active.

14. The apparatus in claim 13, wherein the current source includes another transistor that conducts the start-up current when the transistor for the monitor conducts.

15. The apparatus of claim 5, wherein the activation of the switch is controlled.

16. The apparatus of claim 1, wherein the operation of the current source is controlled.

17. The apparatus of claim 1, wherein the monitor senses one of a current flow and a voltage change in the oscillator when the oscillator is active.

18. The apparatus of claim 1, wherein the monitor includes a first transistor and the current source includes a second transistor such that the first and second transistors form a mirror pair where current flowing in the second transistor is proportional to current flowing in the oscillator when the oscillator is active.

19. The apparatus of claim 1, wherein the current source includes a current amplifier circuit.

20. An apparatus that couples a start-up current into a selected node in a current path of a bias circuit when power is activated, comprising:

an oscillator;

a control means produces a control signal proportional to power consumption in the oscillator;

a current source includes a control input coupled to the control signal such that the current source provides the start-up current proportional to the power consumption of the oscillator; and means for coupling the start-up current to the selected node such that the current path in the bias circuit is forced into a conducting state, whereby said bias circuit is activated.

21. The apparatus in claim 20, further comprising:

means for producing a bias active signal when the bias circuit is in active operation; and means for disabling the oscillator in response to the active signal such that the oscillator is disabled when the bias circuit is active and power consumption is reduced.

22. The apparatus in claim 20, further comprising means for coupling a noise signal into the oscillator circuit to initiate oscillations in the oscillator.

23. A method for forcing a bias circuit into an active state of operation, comprising:

producing an oscillator active signal when an oscillator is oscillating in an oscillator circuit;

producing a start-up current in response to the oscillator active signal;

feeding the start-up current into the bias circuit to force the bias circuit into the active state of operation;

producing a bias active signal when the bias circuit is in the active state of operation; and disabling the oscillator in response to said bias active signal such that the oscillator is inactive when the bias circuit is active and power consumption is reduced.

24. The method of claim 23, further comprising injecting noise into the oscillator circuit to initiate oscillations in the oscillator.

* * * * *

UNITED STATES PATENT AND TRADEMARK OFFICE

CERTIFICATE OF CORRECTION

PATENT NO. : 6,404,252 B1
DATED : June 11, 2002
INVENTOR(S) : Harald Wilsch

It is certified that error appears in the above-identified patent and that said Letters Patent is hereby corrected as shown below:

Column 12,
Line 49, remove the word "and" following the words "such that"

Signed and Sealed this

Twenty-sixth Day of November, 2002

*Attest:*

JAMES E. ROGAN

*Attesting Officer*

*Director of the United States Patent and Trademark Office*